(12) United States Patent
Dawson et al.

(10) Patent No.: US 12,224,721 B2
(45) Date of Patent: Feb. 11, 2025

(54) POWER AMPLIFIER WITH QUASI-STATIC DRAIN VOLTAGE ADJUSTMENT

(71) Applicant: Qorvo US, Inc., Greensboro, NC (US)

(72) Inventors: Joel Lawrence Dawson, Roslindale, MA (US); Gangadhar Burra, Fremont, CA (US); Frederick L. Martin, Plantation, FL (US); Mark Briffa, Tyreso (SE); Rached Hajjii, Murphy, TX (US); Amin Shahverdi, Murphy, TX (US); Elias Reese, Dallas, TX (US); Nikolaus Klemmer, Dallas, TX (US); Jeffrey Gengler, McKinney, TX (US)

(73) Assignee: Qorvo US, Inc., Greensboro, NC (US)

( * ) Notice: Subject to any disclaimer, the term of this patent is extended or adjusted under 35 U.S.C. 154(b) by 579 days.

(21) Appl. No.: 17/488,920

(22) Filed: Sep. 29, 2021

(65) Prior Publication Data

US 2022/0302888 A1    Sep. 22, 2022

Related U.S. Application Data

(60) Provisional application No. 63/163,200, filed on Mar. 19, 2021.

(51) Int. Cl.
*H03F 3/24* (2006.01)
*H01L 29/20* (2006.01)
*H03F 1/02* (2006.01)
*H03F 1/30* (2006.01)

(52) U.S. Cl.
CPC .......... *H03F 3/245* (2013.01); *H01L 29/2003* (2013.01); *H03F 1/0238* (2013.01); *H03F 1/303* (2013.01)

(58) Field of Classification Search
CPC ........ H03F 3/245; H03F 1/0238; H03F 1/303; H03F 2200/451; H03F 1/301; H03F 1/0244; H03F 3/195; H03F 1/0205; H03F 1/56; H03F 3/193; H03F 3/21; H01L 29/2003
USPC ......................................... 330/297, 277, 289
See application file for complete search history.

(56) References Cited

U.S. PATENT DOCUMENTS 8,344,806 B1 *  1/2013  Franck .................... H03F 3/195
                                                    330/285
11,799,327 B2 * 10/2023  Marr, Jr. ................. H02J 50/20

* cited by examiner

*Primary Examiner* — Hieu P Nguyen
(74) *Attorney, Agent, or Firm* — Withrow & Terranova, P.L.L.C.

(57) ABSTRACT

A power amplifier with a quasi-static drain voltage adjustment is provided that has a transistor that is made from Gallium Nitride (GaN). In an exemplary aspect, the transistor is a field-effect transistor (FET) having a source, gate, and drain. The transistor is tested for process variations. Based on detected process variations, a microcontroller may raise a drain voltage to increase output power capability. Power capability of the power amplifier scales as the square of the drain voltage, so small adjustments are sufficient to offset the slow process corner while maintaining reliability.

20 Claims, 5 Drawing Sheets

POWER AMPLIFIER WITH QUASI-STATIC DRAIN VOLTAGE ADJUSTMENT

RELATED APPLICATIONS

This application claims the benefit of provisional patent application Ser. No. 63/163,200, filed Mar. 19, 2021, the disclosure of which is incorporated herein by reference in its entirety.

FIELD OF THE DISCLOSURE

The technology of the disclosure relates generally to providing a power amplifier that compensates for process variations.

BACKGROUND

Wireless communication has become increasingly common in current society, primarily for providing wireless communication to a mobile device or facilitating network communication. A common feature of devices that support wireless communication is a transceiver chain that may include a power amplifier based on a power transistor to boost a signal for transmission. While many types of power amplifiers exist, there is a continual need to improve the efficiency with which the power amplifiers operate.

Most common power amplifiers used in the wireless communication industry are based on semiconductor technologies. Common semiconductor manufacturing technologies make numerous power amplifiers on a single sheet of semiconductive material and then singulate the sheet to provide individual integrated circuits (ICs). While manufacturing processes continue to improve, there may be variations within the single sheet of semiconductive material that cause variations between the individual ICs. Such differences are sometimes referred to as process variations and are typically referred to as Slow, Typical, or Fast.

To compensate for process variations, particularly Slow process variations, most power amplifiers are over-engineered by increasing the physical size of the transistor within the power amplifier so that the power amplifier can provide enough current to meet the output power specification. Increases in the physical dimensions of the power transistor may result in parasitic capacitances at terminals of the device, which lowers the overall efficiency of the device. Accordingly, there is a need to design power amplifiers having transistors that can meet the output power specifications while reducing such parasitic capacitances.

SUMMARY

Embodiments of the disclosure relate to a power amplifier with a quasi-static drain voltage adjustment. In particular, a power amplifier is provided that has a transistor that is made from Gallium Nitride (GaN). In an exemplary aspect, the transistor is a field-effect transistor (FET) having a source, gate, and drain. The transistor is tested for process variations. Based on detected process variations, a microcontroller may raise a drain voltage to increase output power capability. Power capability of the power amplifier scales as the square of the drain voltage, so small adjustments are sufficient to offset the slow process corner while maintaining reliability.

In one aspect, a module is disclosed. The module comprises a power amplifier formed from a GaN material. The power amplifier has a process corner. The module also comprises a microcontroller coupled to the power amplifier. The microcontroller is configured to set a drain bias for the power amplifier based on the process corner.

In another aspect, a power amplifier module is disclosed. The power amplifier module comprises a substrate. The power amplifier module also comprises a power amplifier positioned on the substrate and having a process corner. The power amplifier module also comprises a switching power converter circuit positioned on the substrate and coupled to the power amplifier. The power amplifier module also comprises a microcontroller positioned on the substrate and coupled to the switching power converter circuit. The microcontroller is configured to set a drain bias for the power amplifier based on the process corner through the switching power converter circuit.

In another aspect, a method for using a power amplifier is disclosed. The method comprises identifying a process corner of a power amplifier. The method also comprises using a lookup table to find a drain bias signal. The method also comprises setting a drain bias of the power amplifier based on the drain bias signal.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
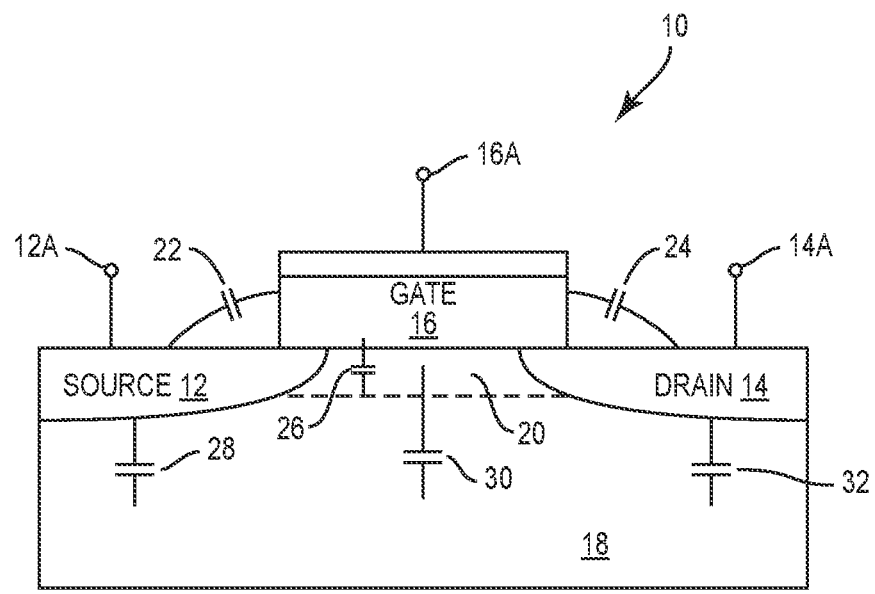
FIG. 1 is a cross-sectional view of a conventional field-effect transistor (FET) showing a source, drain, and gate along with sources of parasitic capacitance.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a power amplifier with a quasi-static drain voltage adjustment. In particular, a power amplifier is provided that has a transistor that is made from Gallium Nitride (GaN). In an exemplary aspect, the transistor is a field-effect transistor (FET) having a source, gate, and drain. The transistor is tested for process variations. Based on detected process variations, a microcontroller may raise a drain voltage to increase output power capability. Power capability of the power amplifier scales as the square of the drain voltage, so small adjustments are sufficient to offset the slow process corner while maintaining reliability.

Figure 2:
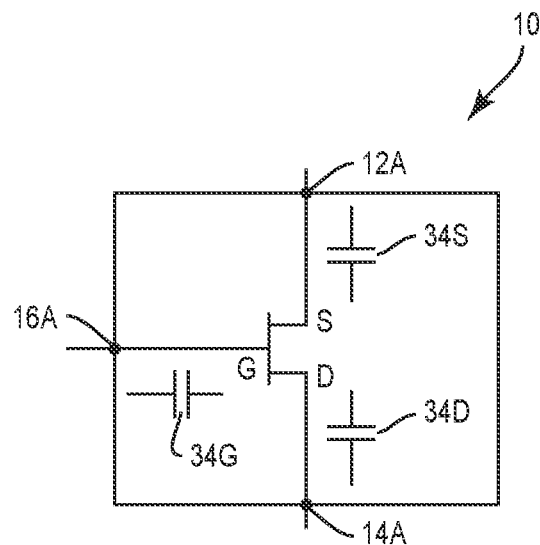
FIG. 2 is a circuit symbol stylized representation of a FET showing the conceptual parasitic capacitance of the FET of FIG. 1.

Before addressing particular aspects of the present disclosure, a brief discussion of the context is provided with reference to FIGS. 1 and 2. A discussion of solutions to the problems with the conventional approaches begins below with reference to FIG. 3 where a quasi-static drain bias is added to a transistor to offset process variations.

In this regard, FIG. 1 is a cross-sectional view of a FET 10 having a source 12, a drain 14, and a gate 16 positioned in or on a substrate 18. Terminals 12A, 14A, and 16A connect to the source 12, drain 14, and gate 16, respectively. A channel region 20 may be formed in the substrate 18. Various parasitic capacitances may be formed between different elements, including a gate-to-source capacitance 22, a gate-to-drain capacitance 24, a gate-to-channel capacitance 26, a source-to-substrate capacitance 28, a gate-to-substrate capacitance 30, and a drain-to-substrate capacitance 32.

Conceptually, the various capacitances can be thought of as capacitances 34S, 34G, and 34D seen at the source terminal 12A, gate terminal 16A, and drain terminal 14A as better illustrated in FIG. 2. It should be appreciated that such capacitances 34S, 34G, and 34D decrease the efficiency of the FET 10 and accordingly decrease the efficiency of any power amplifier into which the FET 10 is incorporated. Other factors that may reduce output power are temperature variation, drift, variations in power supply, and the like. As noted, in many instances the primary way that these inefficiencies are addressed is by increasing the size of the FET to provide enough current to meet the output power specification no matter what combination of circumstances occur. This means, in practice, that most of the time, the parasitic capacitances at the terminals 12A, 14A, and 16A are larger than strictly required, which in turn lowers overall power efficiency.

Exemplary aspects of the present disclosure provide a solution to this engineering trade off. As a first solution, the transistor for use in a power amplifier is made from Gallium Nitride (GaN). GaN devices are nominally rated for use at forty-eight volts (48 V) but readily tolerate voltages at least as high as fifty-five volts (55 V). Further, exemplary aspects of the present disclosure evaluate the transistor to determine a process corner for the transistor and provide a drain bias to raise the drain voltage to increase output power capability. Because the GaN material can handle the high voltages, and small changes in the drain voltage result in large changes in the output power, reliability is maintained. Further, any reduction in bandwidth that might occur as a function of the reduced efficiency is offset.

Figure 3:
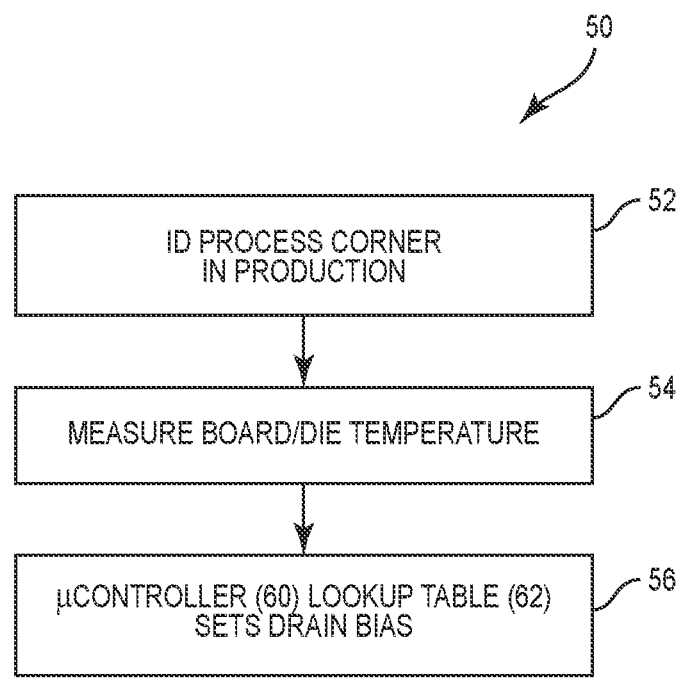
FIG. 3 is a flowchart of a process for setting a bias of the drain during manufacture.

In this regard, FIG. 3 shows a flowchart of a process 50 that is used during production or manufacture. The process 50 begins by identifying a process corner (block 52). This identification may be done by empirical testing or the like. This identification may determine if the transistor is slow, typical, or fast, for example. The process 50 may further measure a board or die temperature (block 54) and use a microcontroller 60 (FIG. 4) to use a lookup table (LUT) 62 (also FIG. 4) to set the drain bias (block 56). That is, based on at least the corner setting, a desired drain bias may be determined and set using the LUT 62. Optionally, the setting may be based on more than just the process corner. There may be other parameters which may be used when designing the LUT 62 such as, for example, temperature or signal frequency.

Figure 4:
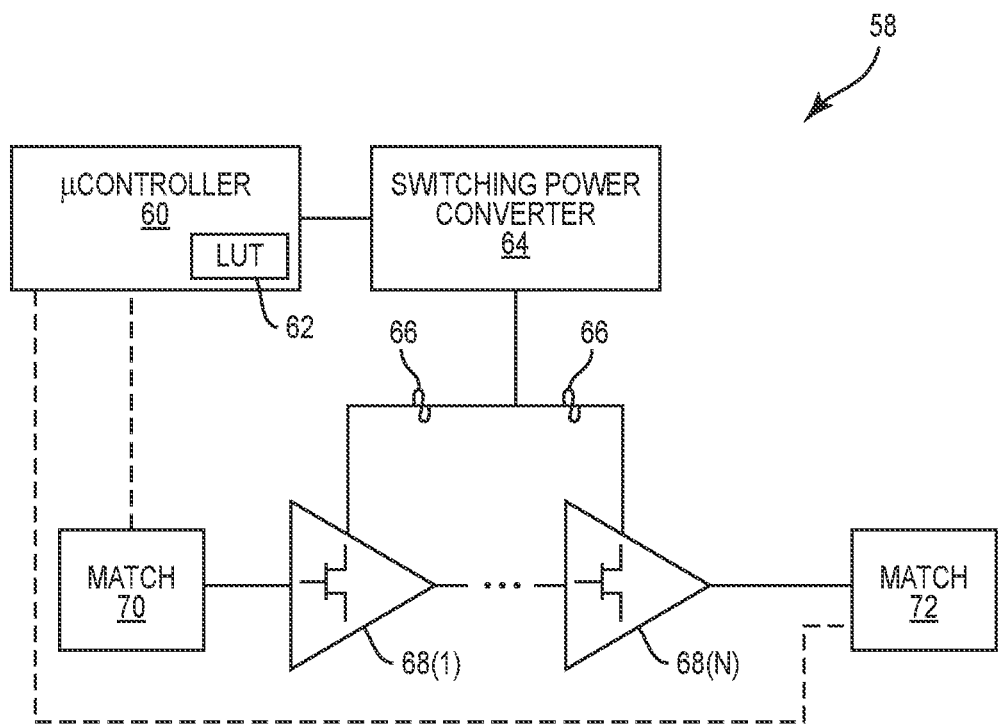
FIG. 4 is a block diagram of a module containing a power amplifier according to the present disclosure with a drain bias.

FIG. 4 shows an exemplary block diagram of a module 58 that may include the microcontroller 60 with its associated LUT 62. The microcontroller 60 uses the LUT 62 to determine a control signal that is sent to a switching power converter circuit 64. The switching power converter circuit 64 provides a drain bias signal 66 to drain terminals of power amplifiers 68(1)-68(N). Optionally, the microcontroller 60 may also provide control signals to an input impedance matching circuit 70 and/or an output impedance matching circuit 72. The presence of the matching circuits 70, 72 allows for better impedance matching since the impedance of the power amplifiers 68(1)-68(N) may change as the drain voltage is applied by the switching power converter circuit 64. While it is possible that the microcontroller 60, switching power converter circuit 64, and power amplifiers 68(1)-68(N) are provided in a single integrated circuit (IC), more likely the microcontroller 60, switching power converter circuit 64, and power amplifiers 68(1)-68(N) will be separate ICs on a single substrate (e.g., a printed circuit board (PCB)) or assembled into some form of module (e.g., a system in a package, system on a chip, or the like). For example, the microcontroller 60, switching power converter circuit 64, and power amplifiers 68(1)-68(N) may be separate ICs assembled in some form of flip chip or stacked arrangement.

Figure 5:
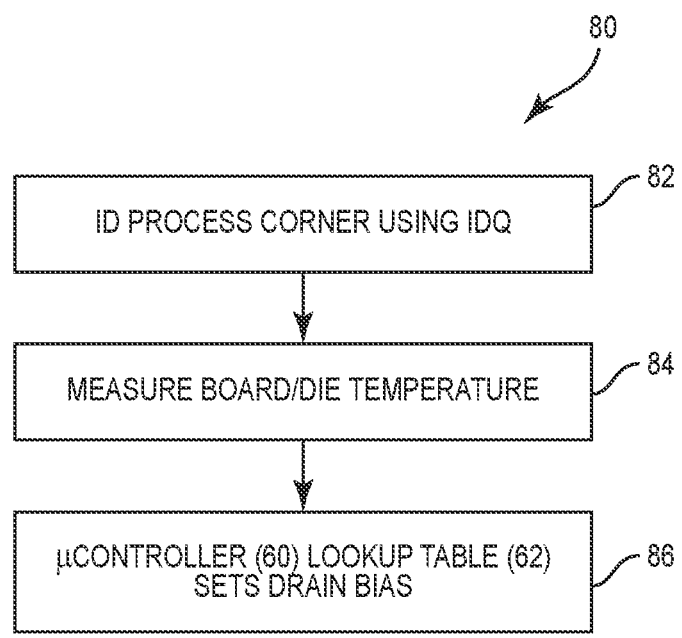
FIG. 5 is a flowchart of a process for setting the bias dynamically after manufacture.

Instead of testing the process corner during production, exemplary aspects of the present disclosure also contemplate testing in situ as illustrated by process 80 in FIG. 5. The process 80 begins by identifying the process corner (block 82) such as by measuring a drain current Idq. The temperature of the board and/or module 58 is measured (block 84) and the microcontroller 60 may use the LUT 62 to set the drain bias (block 86). Again, note that the LUT 62 is designed to set the drain bias based at least on the process corner, but optionally, other parameters may be used when designing the LUT 62. Thus, temperature or frequency may also be considered when designing the LUT 62. Additionally, the microcontroller 60 may determine or receive information relating to a maximum transmitted power, bandwidth, or frequency. The LUT 62 may indicate that the drain bias should be higher when the transmit frequency is higher. Note that this process 80 may be done periodically to compensate for any drift within the module 58. Likewise, both process 50 and process 80 may be done during the lifetime of the module 58.

While the above discussion assumes that the power amplifier is a FET, the present disclosure is not so limited, and the power amplifier could be based on a bipolar junction transistor (BJT).

Figure 6:
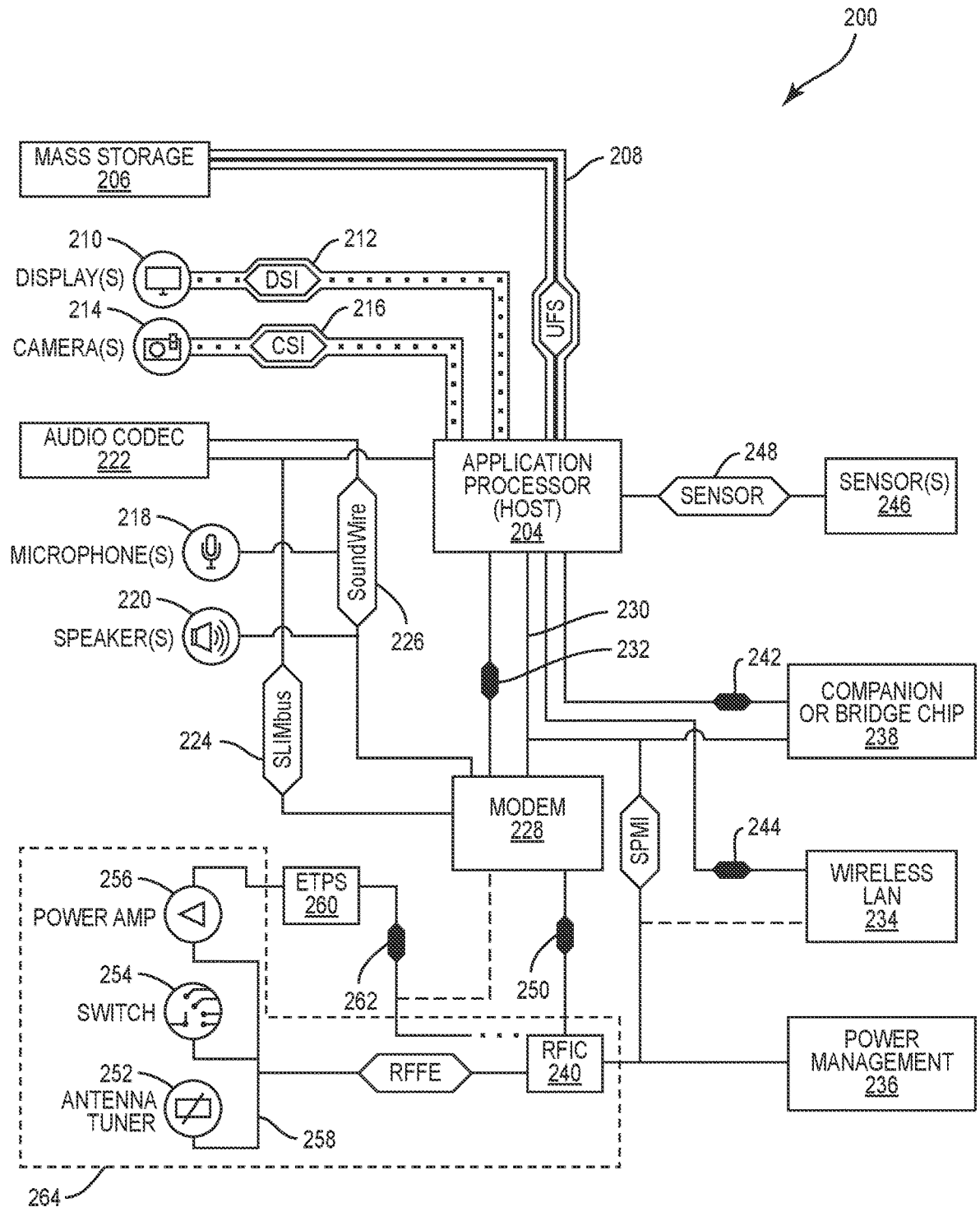
FIG. 6 is a block diagram of a first use case in a mobile communication device.

In an exemplary aspect, the module 58 may be installed in a mobile terminal, such as illustrated in FIG. 6. In this regard, FIG. 6 is a system-level block diagram of an exemplary mobile terminal 200 such as a smart phone, mobile computing device tablet, or the like. The mobile terminal 200 includes an application processor 204 (sometimes referred to as a host) that communicates with a mass storage element 206 through a universal flash storage (UFS) bus 208. The application processor 204 may further be connected to a display 210 through a display serial interface (DSI) bus 212 and a camera 214 through a camera serial interface (CSI) bus 216. Various audio elements such as a microphone 218, a speaker 220, and an audio codec 222 may be coupled to the application processor 204 through a serial low-power interchip multimedia bus (SLIMbus) 224. Additionally, the audio elements may communicate with each other through a SOUNDWIRE bus 226. A modem 228 may also be coupled to the SLIMbus 224 and/or the SOUND-WIRE bus 226. In an exemplary aspect, the modem 228 may include or be associated with the module 58. For example, the power amplifiers 68(1)-68(N) may be within the modem 228 while the microcontroller 60 and switching power converter circuit 64 are external to the modem 228. The modem 228 may further be connected to the application processor 204 through a peripheral component interconnect (PCI) or PCI express (PCIe) bus 230 and/or a system power management interface (SPMI) bus 232.

With continued reference to FIG. 6, the SPMI bus 232 may also be coupled to a local area network (LAN or WLAN) IC (LAN IC or WLAN IC) 234, a power management IC (PMIC) 236, a companion IC (sometimes referred to as a bridge chip) 238, and a radio frequency IC (RFIC) 240. It should be appreciated that separate PCI buses 242 and 244 may also couple the application processor 204 to the companion IC 238 and the WLAN IC 234. The application processor 204 may further be connected to sensors 246 through a sensor bus 248. The modem 228 and the RFIC 240 may communicate using a bus 250.

With continued reference to FIG. 6, the RFIC 240 may couple to one or more RFFE elements, such as an antenna tuner 252, a switch 254, and a power amplifier 256 through a radio frequency front end (RFFE) bus 258. The power amplifier 256 may be part of a module 58. Additionally, the RFIC 240 may couple to an envelope tracking power supply (ETPS) 260 through a bus 262, and the ETPS 260 may communicate with the power amplifier 256. Collectively, the RFFE elements, including the RFIC 240, may be considered an RFFE system 264. It should be appreciated that the RFFE bus 258 may be formed from a clock line and a data line (not illustrated).

Figure 7:
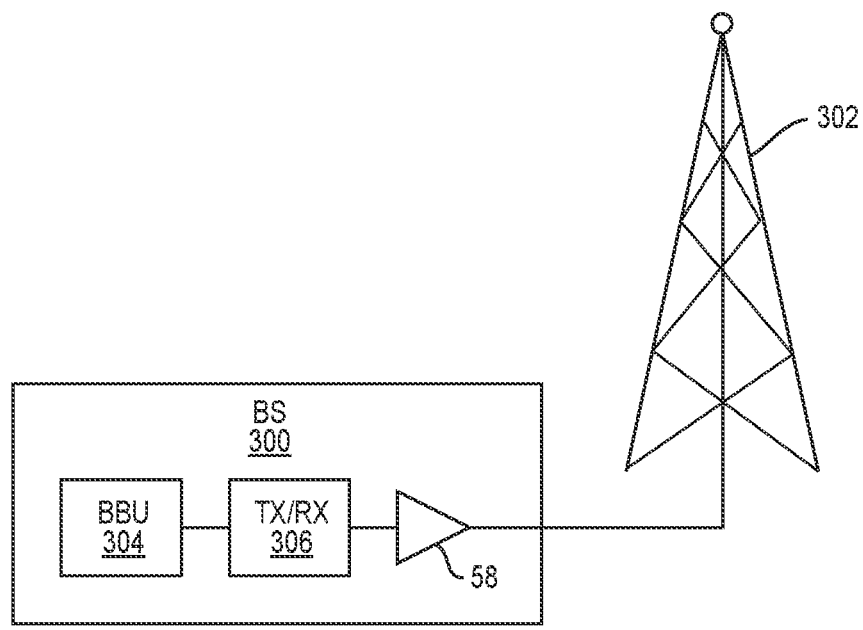
FIG. 7 is a block diagram of a second use case in a base station.

A second use case would be in a base station 300 such as illustrated in FIG. 7. The base station 300 may be associated with an antenna 302, such as can be found on a cell tower or the like. The base station 300 may further include a baseband unit 304, transceiver circuitry 306, and the module 58 to boost the signal for transmission through the antenna 302. The module 58 may be within the transceiver circuitry 306.

Those skilled in the art will recognize improvements and modifications to the preferred embodiments of the present disclosure. All such improvements and modifications are considered within the scope of the concepts disclosed herein and the claims that follow.

What is claimed is:

1. A module comprising:
   a power amplifier formed from a Gallium Nitride (GaN) material, the power amplifier having a process corner;
   a match circuit coupled to an input of the power amplifier; and
   a microcontroller coupled to the power amplifier and the match circuit, the microcontroller configured to:
   set a drain bias for the power amplifier based on the process corner; and
   send a control signal to the match circuit.

2. The module of claim 1, further comprising a switching power converter circuit coupled to the microcontroller and the power amplifier, the switching power converter circuit configured to receive a drain bias signal from the power amplifier and adjust the drain bias for the power amplifier based on the drain bias signal.

3. The module of claim 1, wherein the microcontroller is further configured to identify the process corner of the power amplifier.

4. The module of claim 3, wherein the microcontroller is further configured to identify the process corner of the power amplifier periodically.

5. The module of claim 1, wherein the microcontroller comprises a lookup table.

6. The module of claim 5, wherein the lookup table is configured to store values for a drain bias signal based on a determined process corner for the power amplifier.

7. The module of claim 1, wherein the power amplifier comprises a field-effect transistor (FET).

8. The module of claim 1, wherein the power amplifier comprises a bipolar junction transistor.

9. The module of claim 1, wherein the power amplifier comprises a first integrated circuit (IC) and the microcontroller comprises a second IC.

10. The module of claim 6, wherein the lookup table is further configured to store values for a drain bias signal based on a temperature or frequency for the power amplifier.

11. A power amplifier module comprising:
a substrate;
a match circuit positioned on the substrate;
a power amplifier positioned on the substrate and having a process corner, the power amplifier receiving signals from the match circuit;
a switching power converter circuit positioned on the substrate and coupled to the power amplifier; and
a microcontroller positioned on the substrate and coupled to the switching power converter circuit and the match circuit, the microcontroller configured to:
set a drain bias for the power amplifier based on the process corner through the switching power converter circuit; and
send a control signal to the match circuit.

12. The power amplifier module of claim 11, wherein the power amplifier comprises a field-effect transistor (FET).

13. The power amplifier module of claim 11, wherein the microcontroller comprises a lookup table that is configured to store target drain bias values based on the process corner.

14. The power amplifier module of claim 13, wherein the lookup table is further configured to store the target drain bias values based on a temperature or a frequency.

15. The power amplifier module of claim 12, wherein the FET comprises a Gallium Nitride (GaN) FET.

16. The power amplifier module of claim 11, wherein the microcontroller is configured to test the power amplifier to determine the process corner.

17. The power amplifier module of claim 11, wherein the substrate comprises a printed circuit board (PCB).

18. A method for using a power amplifier, comprising:
identifying a process corner of a power amplifier;
using a lookup table to find a drain bias signal based on the process corner;
sending a control signal to a match circuit based on the process corner; and
setting a drain bias of the power amplifier based on the drain bias signal.

19. The method of claim 18, wherein identifying the process corner comprises identifying the process corner during production.

20. The method of claim 18, wherein identifying the process corner comprises identifying the process corner periodically during operation of the power amplifier.

* * * * *